United States Patent
Huang et al.

(10) Patent No.: US 12,372,569 B2
(45) Date of Patent: Jul. 29, 2025

(54) METHODS FOR ACCELERATING THE INSULATION RESISTANCE MEASUREMENT IN AN UNGROUNDED POWER SUPPLY SYSTEM

(71) Applicant: Bender GmbH & Co. KG, Gruenberg (DE)

(72) Inventors: Zhongkui Huang, Pohlheim (DE); Matthias Gruen, Homberg (DE)

(73) Assignee: Bender GmbH & Co. KG, Gruenberg (DE)

( * ) Notice: Subject to any disclaimer, the term of this patent is extended or adjusted under 35 U.S.C. 154(b) by 0 days.

(21) Appl. No.: 18/383,303

(22) Filed: Oct. 24, 2023

(65) Prior Publication Data

US 2024/0133939 A1   Apr. 25, 2024
US 2024/0230745 A9   Jul. 11, 2024

(30) Foreign Application Priority Data

Oct. 25, 2022   (DE) ............... 10 2022 128 126.4

(51) Int. Cl.
*G01R 31/12*   (2020.01)

(52) U.S. Cl.
CPC ................ *G01R 31/1272* (2013.01)

(58) Field of Classification Search
CPC .. B60L 3/0069; G01R 27/025; G01R 31/1272
See application file for complete search history.

(56) References Cited

U.S. PATENT DOCUMENTS

| | | | |
|---|---|---|---|
| 2003/0234653 A1* | 12/2003 | Kollenda | G01R 31/52 324/551 |
| 2016/0216220 A1* | 7/2016 | Eyssler | G01R 27/025 |
| 2022/0413033 A1* | 12/2022 | Jang | G01R 31/1272 |

FOREIGN PATENT DOCUMENTS

| | | |
|---|---|---|
| DE | 10106200 C1 | 9/2002 |
| DE | 102009048294 A1 | 1/2011 |
| DE | 102019103396 B3 | 7/2020 |
| DE | 102021101693 B3 | 6/2022 |
| DE | 102021203919 A1 | 10/2022 |
| WO | WO-2011160881 A1 * | 12/2011 ............. G01R 27/18 |

* cited by examiner

*Primary Examiner* — Yoshihisa Ishizuka
(74) *Attorney, Agent, or Firm* — Dickinson Wright, PLLC; Andrew D. Dorisio

(57) ABSTRACT

Methods are provided for accelerating the insulation resistance measuring for determining an insulation resistance according to a pulse measuring method in an ungrounded power supply system. After indicating a target charging state of the network capacities available, a target point in time is calculated at which the network capacities have reached the target charging state. A first wait time is calculated from the current point in time as the difference between the target charging state and the current point. Alternatively, a target charging rate reflects a sufficiently stationary charging state of the capacitors, valid for measuring the insulation resistance. The target charging rate corresponds to the derivative of the first order of the target charging voltage and thus linked to the target point in time. Using the derivatives of the first order, a time difference is calculated as a second wait time.

7 Claims, 12 Drawing Sheets

State of the Art

METHODS FOR ACCELERATING THE INSULATION RESISTANCE MEASUREMENT IN AN UNGROUNDED POWER SUPPLY SYSTEM

This application claims priority to German Patent Application No. 10 2022 128 126.4 filed on Oct. 25, 2022, the disclosure of which is incorporated herein by reference.

TECHNICAL FIELD

The invention relates to methods for accelerating the insulation resistance measurement for the application in a method for determining an insulation resistance according to a pulse measuring method in an ungrounded power supply system (IT system).

BACKGROUND

The application in both variations of the method according to the invention presupposes an existing, superordinate method for insulation monitoring, in which, according to a pulse measuring method in an ungrounded power supply system, a measuring voltage compiled of temporally consecutive square measuring pulses is applied between at least one active conductor of the ungrounded power supply system and ground by means of a measuring pulse generator via a coupling branch having a coupling resistance and a continuous-time curve of a voltage measured via the measuring resistance is captured.

Beside the use of the method according to the invention for stationary ungrounded power supply systems, e.g., industrial plants or hospitals, in particular electric mobility with regard to electrical safety deserves special attention.

In the automobile industry, the monitoring of the insulation resistance of the ungrounded power supply system is gaining in importance, as the power supply system in the electric vehicle is an insulated power supply system and the insulation resistance is an important indicator for the state of quality of the on-board electric installation.

For this reason, insulation monitoring devices are used to continuously monitor the insulation resistance. In test standard LV 123, test conditions for the test of high-voltage components are specified for electric vehicles. For the insulation resistance measurement, a differentiation is made between two measuring modes: on the one hand standard LV123-639 for normal operation, and on the other hand LV123-1735 for quick-start mode.

Standard LV123-639 discloses that the duration until a valid insulation resistance result is output must be less than 30 s, provided the requirements documentation of the original equipment manufacturer does not contain any other specifications.

If quick insulation monitoring is required, standard LV123-1735 requires that the duration until a valid insulation resistance value is output must be less than 5 s and a measuring tolerance of 0% to −50% must be maintained in the range of 100 Ohm/V to 500 Ohm/V.

Moreover, standard LV123-1734 specifies that the duration until a valid insulation resistance value is output is indicated as a function of the value of leakage capacitances and Y-capacitors until 2 μF and as a function of the high-voltage potential.

In conjunction with standard DIN EN 61557-8, which describes the requirements to insulation monitoring devices for IT systems, a quick-start of the insulation resistance monitoring is also of great importance. Thus, it seems sensible if, in connection with the insulation monitoring, the driver received a message after starting the electric system which states that the insulation state of the on-board network is "safe" or assesses it to be "not safe" in the sense of a warning or error message.

The quick-start requirements of proving an insulation resistance value within 5 s cannot always be fulfilled, as the leakage capacitances of the IT network (on-board network of the electric vehicle) and the Y-capacitors of a user often in conjunction with insulation monitoring according to the pulse measuring method still have a residual voltage owing to the charge reversal with the measuring impulse of a preceding measuring cycle. A premature statement, i.e., detected during the (reverse) charging process, on the insulation state, in particular a statement on whether the quick-start requirement is being fulfilled, is not possible at this moment according to the state of the art, as all methods are based on information which is not available until after the (reverse) charging process has been terminated.

In the state of the art, document DE 10 2021 101 693 B3 in conjunction with a pulse measuring method for insulation monitoring discloses a method for measuring-pulse fault identification in which time constants are continuously calculated and an indication on the reliability of the insulation resistance measurement is derived therefrom. A statement on whether the quick-start requirement can be fulfilled is not made.

SUMMARY

The object of the invention is therefore to propose a method by means of which a statement on the insulation state can be made as soon as possible together with a pulse measuring method for insulation monitoring, in particular a statement on whether the requirement of providing an insulation resistance value can be fulfilled within the pre-specified quick-start time.

This object is attained by indicating a target charging state of the network capacities available in the ungrounded power supply system, calculating a target point in time at which the network capacities have reached the target charging state from the target charging state and the effective tau value, calculating a first wait time starting from the current point in time as the difference between the target charging state and the current point in time, and outputting a safe-to-start signal should the first wait time be less than an indicated quick-start time, otherwise outputting a not-safe-to-start signal.

Basis of the considerations are measuring methods for insulation monitoring which are known from the state of the art and use a clocked measuring voltage for which a measuring voltage compiled of temporally consecutive square measuring pulses are supplied between at least one active conductor of the power supply system and ground (chassis of the electric vehicle) by the measuring-impulse generator of the insulation monitoring device (insulation monitoring apparatus) according to the pulse measuring method. In this measuring circuit, a current is set which flows via the insulation resistance and causes a proportional voltage drop at a measuring resistance. A measurement of this voltage (measured voltage) gives an indication on the size of the insulation resistance and thus on the insulation state of the (automobile) ungrounded power supply system.

Since the ungrounded power supply system has inevitable electric capacities (network leakage capacities) and Y-capacitors of the users against ground for suppressing interferences, the precision and in particular the speed of the measurement of the insulation resistance are negatively impacted.

In the following, the network leakage capacitances and Y-capacitors are summarized under the term network capacities and this capacitive arrangement is simplistically referred to as capacitor.

From the observation of the capacitance-charging e-function (natural exponential function) and the time constants derived therefrom and negatively impacted by the inner resistance of the insulation monitoring apparatus, the insulation resistance and the network capacities (RC circuit), important discoveries regarding the insulation state, in particular when booting a mobile on-board network, can be obtained when charging and uncharging the network capacities.

In a first method step, a sequence of time-discrete output-voltage measured values, which are stored for further calculation, is formed from the (continuous) curve of the measured voltage by means of digital signal processing.

In the subsequent calculations, the mathematical principles, which are valid for the derivation laws of the e-function, are applied to the technical situation of the capacitance-charging e-function via which the voltage curve is described when charging the network capacities in the ungrounded power supply system.

Starting point for these observations is the following relation—here simply expressed with continuous-time variables of a voltage curve V(t) (capacitor voltage) for a general RC circuit:

$$\frac{V'(t)}{V''(t)} = -RC = -tau \text{ with } V(t) = V_0 * \left(1 - e^{-\frac{t}{RC}}\right)$$

when charging and $V(t) = V_0 * e^{-\frac{t}{RC}}$ when discharging, with V'(t) and V"(t) being first and second continuous-time derivatives of V(t).

For the digital signal processing of the time-discrete measured values, the continuous-time derivatives transition into derivatives of the first and second order. The time-discrete outlet-voltage measured values and their derivatives of the first and second order consequently serve as the basis for the subsequent calculation of time constants.

The time constants result as negative quotient from a derivative of the first order and from a derivative of the second order of temporally subsequent time-discrete output-voltage measured values in a calculation period, which is within a settling phase of the square measured pulse.

The calculation period, in which the calculation of the time constants is continuously applied to the time-discrete outlet-voltage measured values, extends within the settling phase of the square measured pulse from the point of termination of the settling phase of the low-pass filter until the beginning of the saturation phase of the time-discrete outlet-voltage measured values.

By applying one-step or multi-step time-constant averaging, an effective tau value is calculated from the thus formed time constant as time constant concludingly available for further calculations, the time constant being assumed as the basic variable in the test as to whether the quick-start conditions can be fulfilled.

In a first variation of the method according to the invention, a pre-specified target charging state serves as the input parameter for the network capacities available in the ungrounded power supply system, the target charging state describing the relationship of the target charging voltage achieved in this target charging state to a stationary final value (full charging voltage) of the voltage (capacitor voltage) supplied via the network capacity. A (percentage of a) target must therefore be known which reflects a sufficiently stationary charging state of the capacitors valid for the insulation resistance measurement and is pre-specified by means of a percentage, with respect to a full charging voltage of the capacitors. For instance, 99% of the full charging voltage (target charging state 0.99) should be attained in order to be able to test whether this target charging state is attainable within an intended quick-start time.

Using the target charging state and the effective tau value, the target point in time can be determined and therefrom a first wait time starting from the current point in time as the difference between the target point in time and the current point in time can be calculated.

In conclusion, a safe-to-start signal (ss) is output should the first wait time (dTr) be less than a pre-specified quick-start time (Ts), otherwise a not-safe-to-start signal (ns) is output.

In another embodiment, the time-discrete output-voltage measured values are formed by generating a sequence of time-discrete input-voltage measured values by sampling the curve of the measured voltage with a pre-specified sampling rate; by calculating the time-discrete output-voltage measured values from the time-discrete input-voltage measured values via measured-value averaging via sample-rate reduction; and by calculating filtered voltage measured values via digital low-pass filtering of decimated voltage measured values.

By means of methods of digital signal processing, the time-discrete input-voltage measured values are consequently transformed via decimated voltage measured values and filtered voltage measured values in the time-discrete output-voltage measured values after having sampled the curve of the measured voltage.

The measured-value averaging can be executed in several steps, a sampling-rate reduction taking place simultaneously.

On the one hand, noise portions distorting the measurement can be significantly reduced owing to this; on the other hand, the number of sampling values per time unit to be further processed is reduced via a continuous summarization of the time-discrete input-voltage measured values to an average, which corresponds to the reduction of the sampling rate and whereby fewer requirements to the calculation performance and memory requirements are made for the execution of subsequent signal processing algorithms.

Advantageously, the measured-value averaging comprises a first averaging, the decimated voltage measured values each being formed consecutively without overlap via a number N of the time-discrete input-voltage measured values.

In this context, temporally consecutive N time-discrete input-voltage measured values in blocks and without block overlap are taken into consideration for calculating a linear average valid for the corresponding block. The combination of the corresponding N time-discrete input-voltage measured values leads to a sequence of decimated voltage measured values which represent the corresponding average and have a significantly lower noise portion.

Further, the measured-value averaging comprises a second averaging, the time-discrete output-voltage measured values each being formed consecutively without overlap via a number M of the filtered voltage measured values and the number M being adapted to the temporal behavior of the time-discrete output-voltage measured values.

Consequently, another block-wise linear averaging of consecutive filtered voltage measured values without overlap takes place, the number M of the filtered voltage measured values summarized in blocks, however, being able to be adapted in this manner to the temporal curve of the time-discrete output-voltage measured values in comparison to the first averaging.

In order to reduce the necessary calculating time and still obtain an as precise as possible digital representation of the capacitive-charging voltage curve, a shorter block length is chosen for a quick temporal change of the time-discrete output-voltage measured values, for instance, i.e., a smaller number M of filtered voltage measured-values is combined to a linear average than for a smaller temporal change of the time-discrete output-voltage measured values.

Preferably, the adaption takes place via a first control, which sets the number M as a function of the derivative of the second order ($V''_i$) of the time-discrete output-voltage measured values ($V_i$) in such a manner that the derivative of the second order ($V''_i$) of the time-discrete output-voltage measured value ($V_i$) is within an admissible first value range.

The derivative of the second order of the time-discrete output-voltage measured values is used as a scale and adaption criterion in order to adapt the temporal behavior of the time-discrete output-voltage measured values as precisely as possible to the true temporal curve of the measured voltage.

For the derivative of the second degree of the time-discrete output-voltage measured values, an admissible first value range is determined within which the derivative can move. By means of a feedback loop in the first control, the derivative of the second degree calculated based on the time-discrete output-voltage measured values is fed back and evaluated, the number M of the filtered voltage measured values combined in blocks being set such that this derivative is within the admissible first value range.

Advantageously, an interleaved tau average and a tau derivative of the second order are calculated for calculating the effective tau value continuously from three time constants each, which are combined in an interleaved manner, a second control taking place which sets the number M as a function of the tau derivative of the second order in such a manner that the tau derivative of the second order is within an admissible second value range, and subsequently an averaging takes place via a number K of the interleaved tau averages for calculating the effective tau value.

Further, a stationary final value (full charge voltage) of the capacitor voltage is calculated from one of the stored, time-discrete voltage measured values, from the correspondingly assigned point in time and from the effective tau value to obtain $$V\text{stat}=Vi/(1-e^{-ti/tau\_eff})$$

The object of the invention is also attained by indicating a target charging rate, which is to be achieved in a target point in time at the network capacities available in the ungrounded power supply system; by calculating a second wait time starting from the T2 point in time (t=T2) as the difference between the target point in time and the T2 point in time from the effective tau value and the quotient from the target charging rate and the determined derivative of the first degree to the T2 point in time; and by outputting a safe-to-start signal should the second wait time be less than a pre-specified quick-start time, otherwise outputting a not-safe-to-start signal.

Including the method step of calculating the effective tau value, the second variation of the method according to the invention which coincides with the method steps of the first variation.

In the second variation, alternatively to the first variation, not the target charging state is indicated as the input parameter, but a target charging rate, which reflects a charging state of the capacitors which is valid and sufficiently stationary for measuring the insulation resistance. The target charging rate corresponds to the derivative of the first order of the target charging voltage and is consequently linked to the target point in time. In view of the previously determined and stored derivative of the first degree to the T2 point in time (t=T2), a time difference to the stored T2 point in time is calculated as a second wait time.

Equally, the other embodiments in the claims directly or indirectly referring to the second variation correspond to the embodiments valid for the first variation.

The idea on which the method according to the invention in the first and second variation is based thus consists of being able to advantageously predict a charging state valid for calculating the insulation resistance, the charging state being described by, for instance, charging parameters such as the charging time or the full charging voltage, based on the running charging or discharging process—in contrast to methods known in the state of the art in which the charging parameters are only known when the charging/discharging process has been actually terminated. Consequently, the calculated wait times according to the invention no longer require an evaluation unit (controller) to constantly sample the analog-to-digital converter in an energy-intensive manner to demand the current charging state.

BRIEF DESCRIPTION OF THE DRAWINGS

Further advantageous embodiment features are derived from the following description and the drawings, which describe a preferred embodiment of the invention by means of examples.

DETAILED DESCRIPTION

Figure 1:
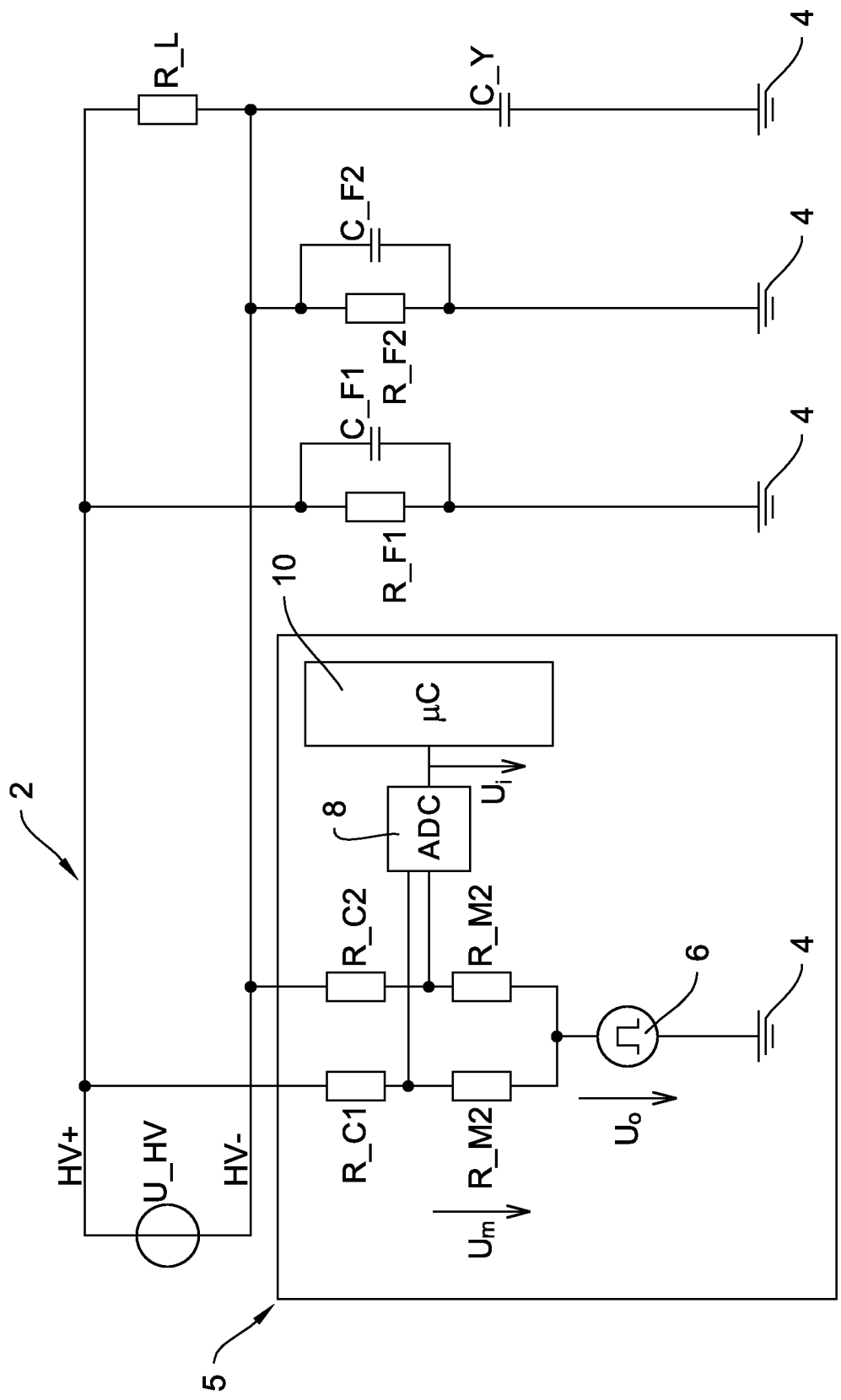
FIG. 1 shows the determination of an insulation resistance in an ungrounded power supply system according to the state of the art.

In a functional block diagram, FIG. 1 shows the determination of an insulation resistance R_F1, R_F2 in an ungrounded power supply system 2 according to the state of the art.

Ungrounded power supply system 2 is exemplarily configured as an on-board network of an electric vehicle in this instance and consists essentially of both active conductors HV+ and HV−, via which a direct-voltage source U_HV supplies load R_L with power. Aside from insulation resistances R_F1, R_F2 to be determined, ungrounded power supply system 2 is characterized by (natural) network leakage capacitances C_F1, C_F2, which form between corresponding active conductor HV+, HV− against ground 4 and are shown as concentrated structural elements in this instance. Y capacitors C_Y, which serve for suppressing (clocked) interferences, act between load R_L and ground 4.

For monitoring insulation resistances R_F1, R_F2, an insulation monitoring device (IMD) 5 is installed, which has a measuring pulse generator 6, which supplies a measuring voltage $U_0$ between each one of active conductors HV+, HV− and ground 4 in ungrounded power supply system 2. Measuring voltage $U_0$ is compiled of temporally consecutive square measuring pulses. At each measuring resistance R_M1, R_M2, a measured voltage $U_m$ is registered, which is converted in an analog-to-digital converter 8 (ADC) via sampling with a sampling rate fs in a sequence of time-discrete input-voltage measured values $U_i$, the sequence of time-discrete input-voltage measured values $U_i$ being supplied to a downstream digital signal processing unit 10 for determining insulation resistances R_F1, R_F2.

Ungrounded power supply system 2 and insulation monitoring device 5 thus represent the application environment for method 30, 40 according to the invention for quickly measuring the insulation resistance in the first and second variation.

Figure 2B:
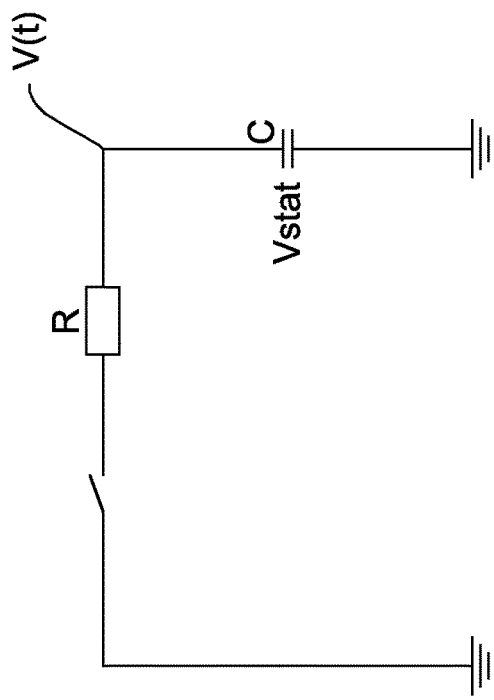
FIGS. 2A, 2B: show an equivalent circuit diagram for charging/discharging a capacitor.
Figure 2A:
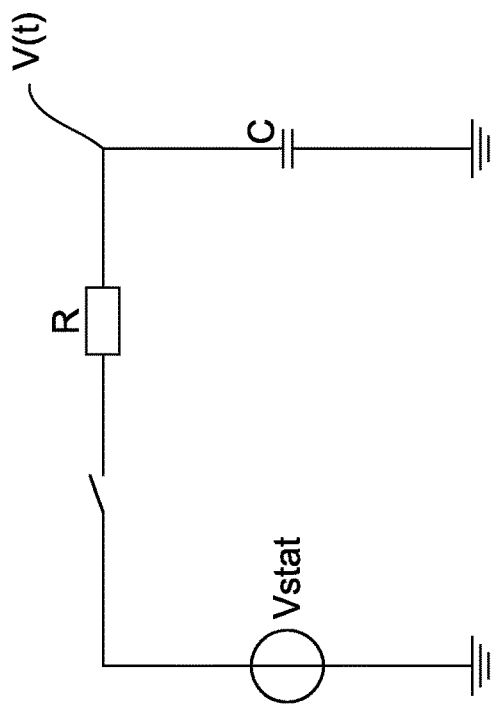

FIGS. 2A and 2B each show an equivalent circuit diagram for charging/discharging a capacitor C via a resistance R. In the following view, capacitor C can be considered a parallel circuit from network leakage capacitances C_F1 and C_F2 and Y capacitors C_Y from FIG. 1 and is charged to a stationary final value Vstat (full load voltage, source voltage).

Figure 3A:
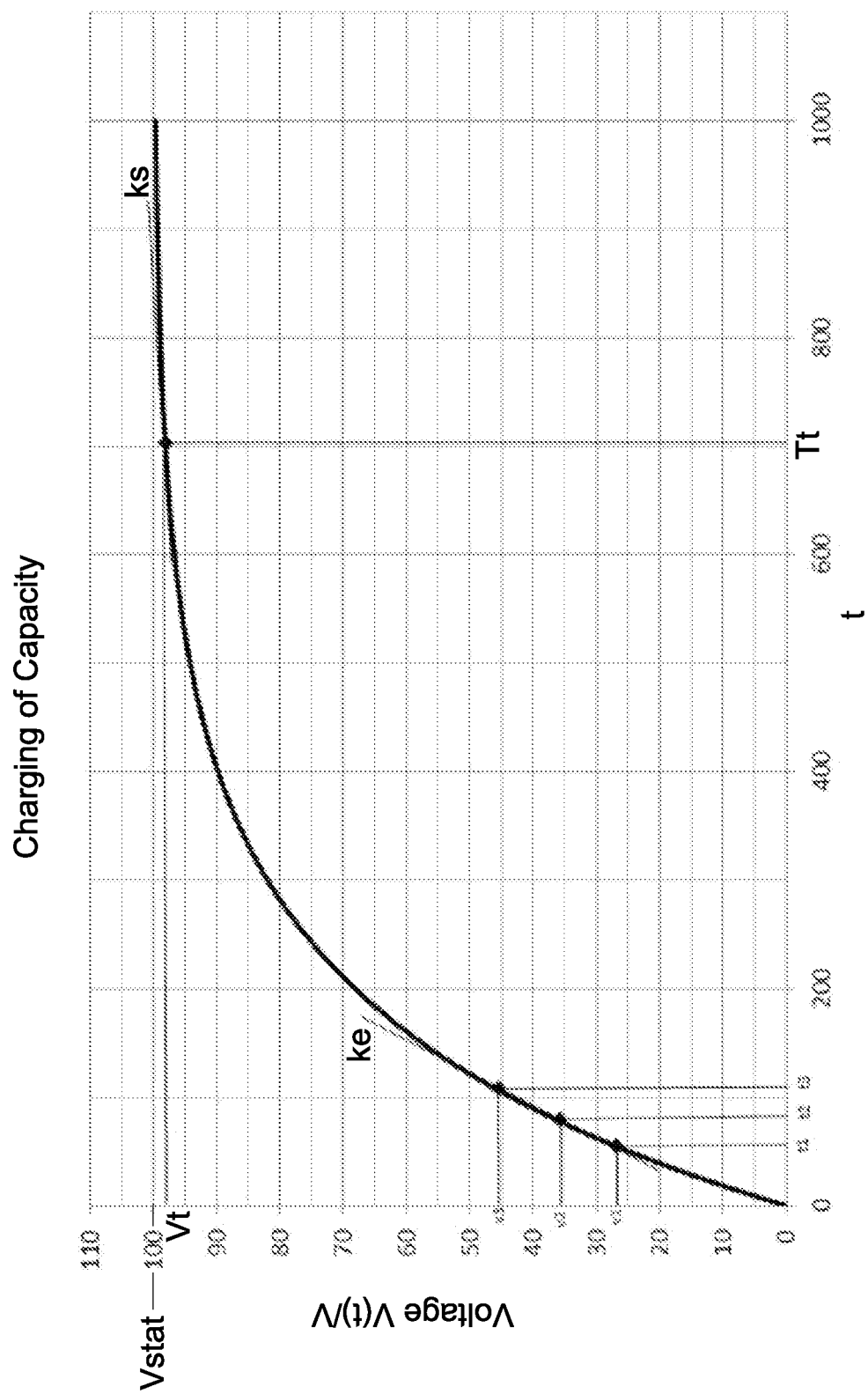
FIGS. 3A, 3B: shows a temporal curve of a capacitor voltage when charging/discharging the capacitor.
Figure 3B:
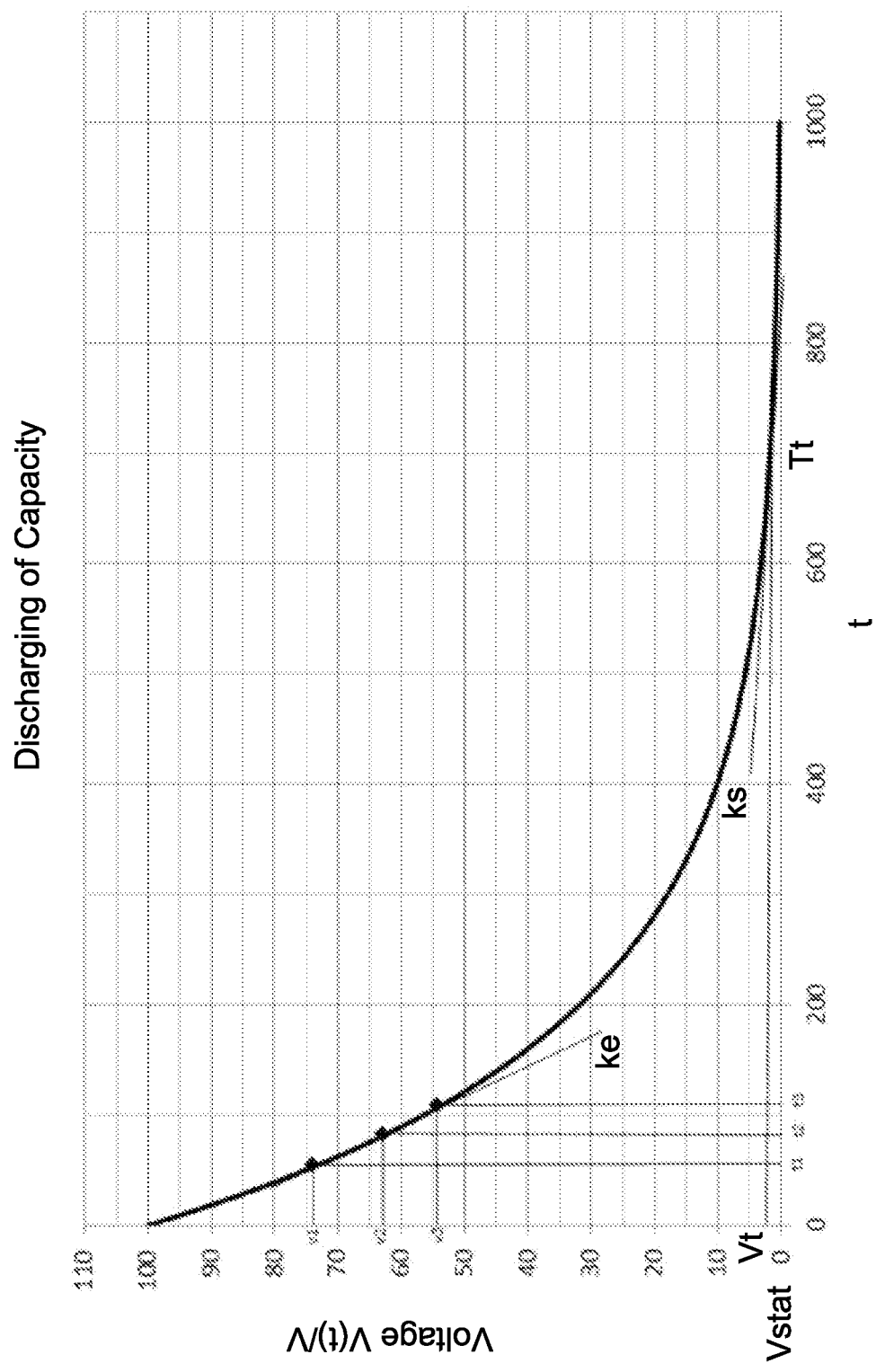

FIG. 3A and FIG. 3B show a continuous-time view of the temporal curve of capacitor (charging/discharging) voltages V(t) which settles when charging and discharging the capacitors according to FIGS. 2A and 2B.

The curve follows an exponential function, which asymptotically approximates source voltage Vstat or value zero. Sketched in the drawing are capacitor voltages V(t)=V1, V2, V3, Vt assigned to points in time t=t1, t2, t3, Tt.

To depict the different charging rates, i.e., the temporal change (derivative) of capacitor voltage V(t), in a settling phase and a saturation phase, additionally two tangents ke (settling phase) and ks (saturation phase) are sketched. In a time-discrete view, temporal derivatives correspond to derivatives of the first order.

Figure 4:
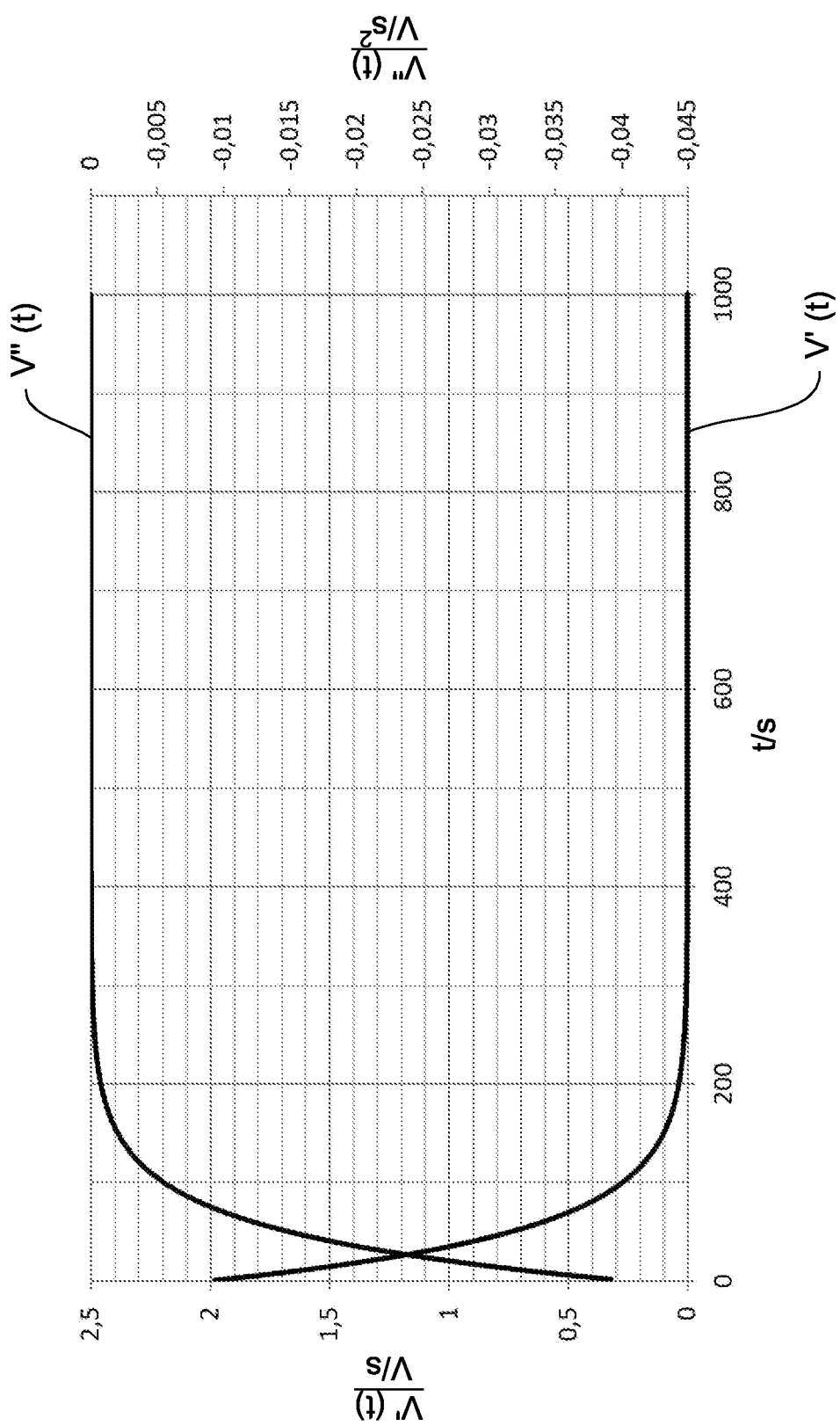
FIG. 4: shows a derivative of the first and second order of the voltage curve according to FIG. 3A.

FIG. 4 shows derivatives of the first and second order V'(t), V"(t) (first and second derivatives) of the voltage curve of capacitor voltage V(t) according to FIG. 3A. It is visible that derivatives of the first and second order V'(t), V"(t) themselves have an exponential curve and opposite signs.

Figure 5:
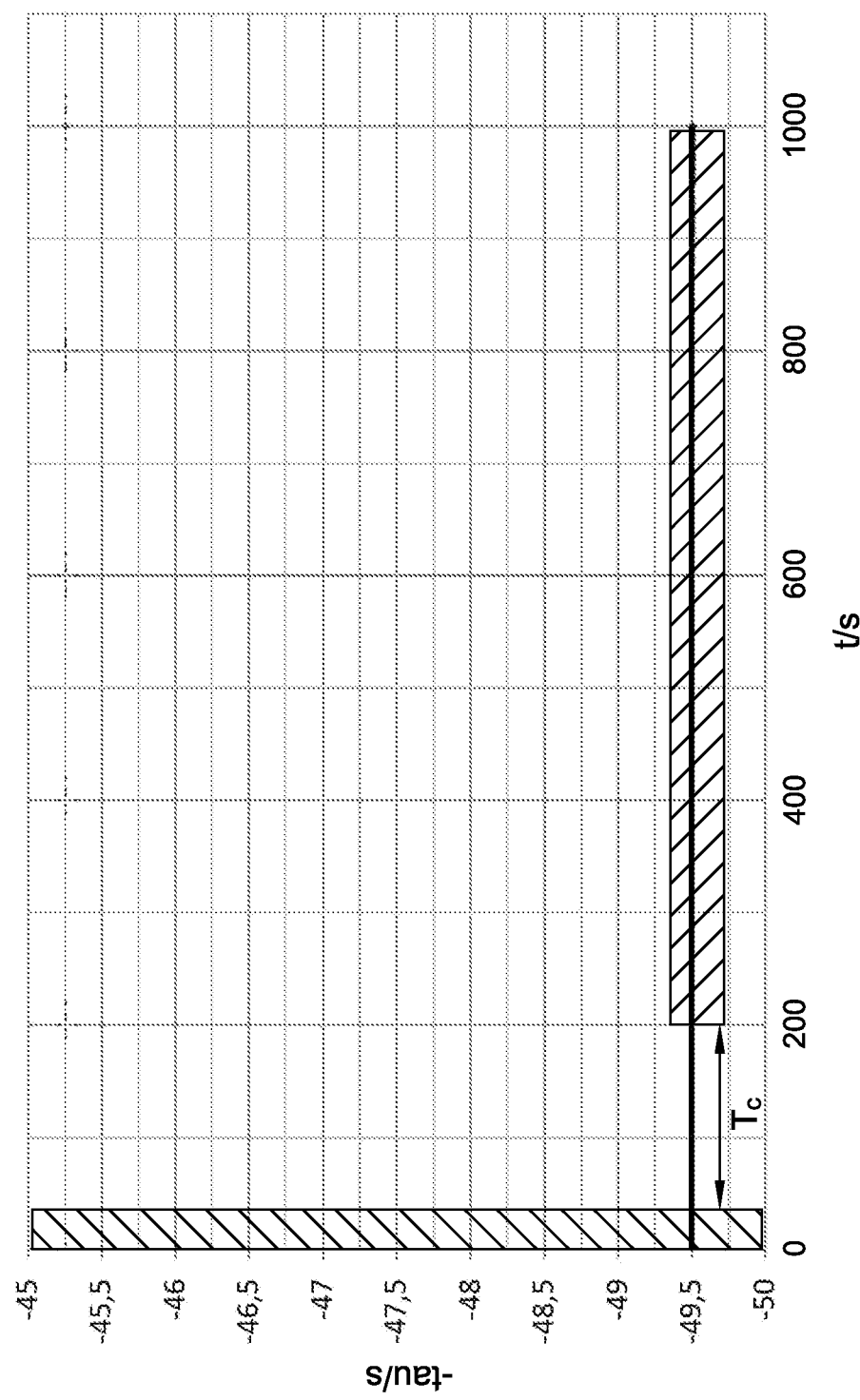
FIG. 5: shows a negative time constant as a quotient from the derivatives according to FIG. 4.

Derived from the view of derivatives V'(t), V"(t) in FIG. 4, FIG. 5 shows quotients V'(t)/V"(t) from derivative of the first order V'(t) divided by derivative of the second order V"(t). This quotient V'(t)/V"(t) corresponds to negative time constant −tau $$\frac{V'(t)}{V''(t)} = -RC = -tau$$

Figure 6:
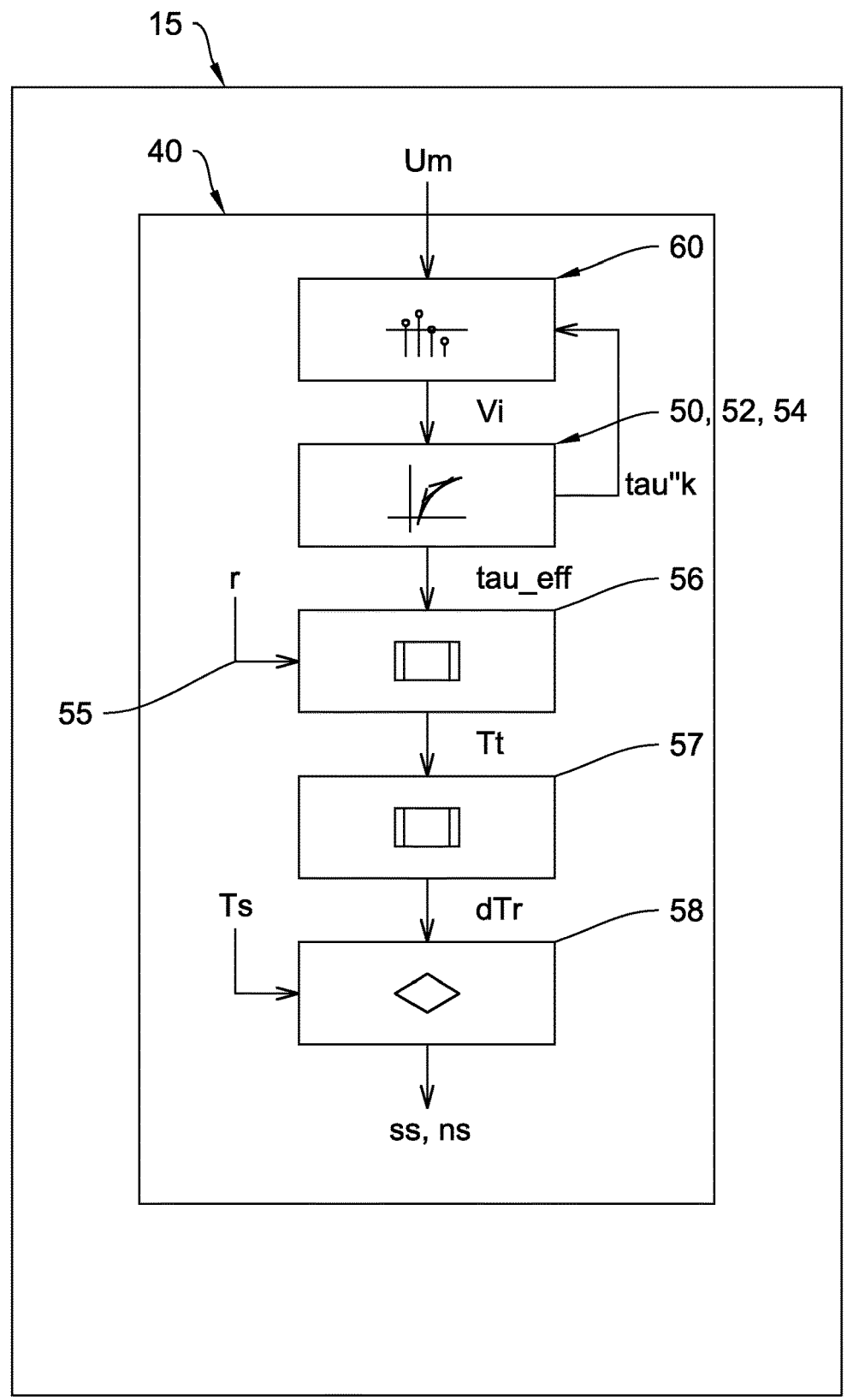
FIG. 6: shows a sequence diagram of the method according to the invention having a parameter of a target charging state (first variation)

FIG. 6 shows a sequence diagram of method 40 according to the invention having indication 55 of a target charging state r (first variation) within method 15 for determining the insulation resistance.

Starting from the continuous-time curve of measured voltage $U_m$, a sequence of time-discrete output-voltage measured values $V_i$ are formed and stored in block 60.

Figure 8:
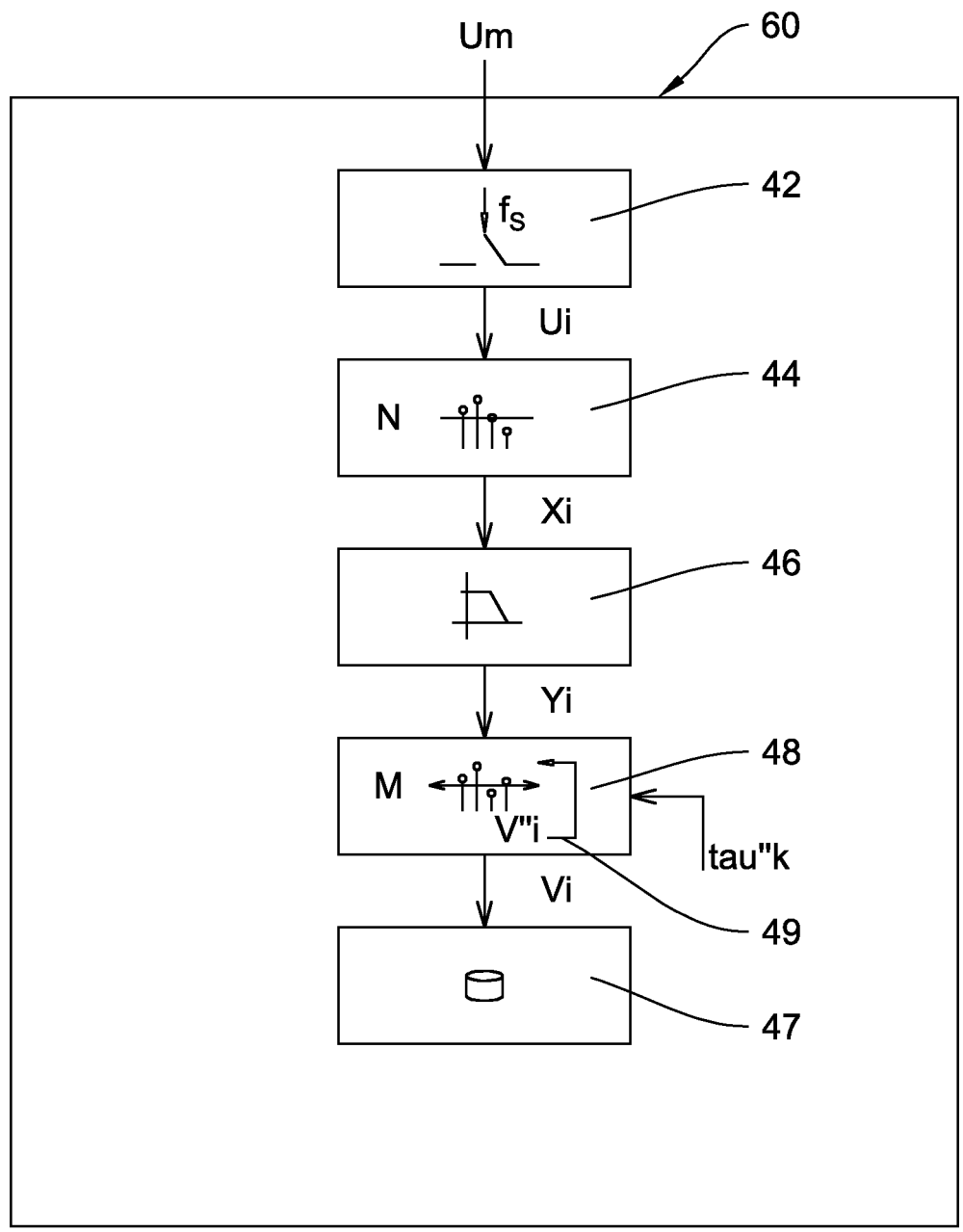
FIG. 8: shows a sequence diagram for forming and storing the outlet-voltage measured values having measured-value averaging.

FIG. 8 describes the method steps required in block 60 for forming and storing the output-voltage measured values $V_i$ in a sequence diagram.

By sampling 42 the curve of measured voltage $U_m$ using a sampling rate fs by means of an analog-to-digital converter, a sequence of time-discrete input-voltage measured values $U_i$ is generated for the subsequent digital signal processing steps.

Time-discrete output-voltage measured values $V_i$ is calculated from time-discrete input-voltage measured values $U_i$ by a two-step measured-value averaging 44, 48 having a first averaging 44 and a second averaging 48 and a digital low-pass filtering 46 executed between first averaging 44 and second averaging 48.

In first averaging 44, a linear temporal average is formed for each consecutive block without overlap, each block having a number N of time-discrete measured values $U_i$, meaning a sequence of decimated voltage measured values $X_i$ appears as the output signal of first averaging 44. In this context, the number N of input-voltage measured values $U_i$ to be combined to one block can be preset, although it remains constant during the method sequence.

Via subsequent digital low-pass filtering 46 of decimated voltage measured values $X_i$, a sequence of filtered voltage measured values $Y_i$ is calculated.

Analogously to first averaging 44, consecutive blocks without overlap are first formed having a number M of filtered voltage measured values $Y_i$ in a second averaging 48. For each block, a linear temporal average is calculated which yields the sequence of time-discrete output-voltage measured values $V_i$.

However, in contrast to first averaging 44, the number M of filtered voltage measured values $Y_i$ to be summarized is adapted to the temporal behavior of time-discrete output-voltage measured values $V_i$ in second averaging 48.

This adaption takes into consideration the temporal changes (change speed) of time-discrete output-voltage measured values $V_i$. As a criterion for the temporal change, preferably the value of derivative of the second order $V''_i$ is taken into consideration.

By means of a first control 49, the result of a calculation of derivative of the second order $V''_i$ is coupled back and compared to an admissible first value range, which is indicated by limits [0.5, 2], for example. The number M of filtered voltage measured values $Y_i$ to be summarized is set such by first control 49 that derivative of the second order $V''_i$ is within the admissible first value range, meaning it can be presumed that time-discrete output-voltage measured values $V_i$ correctly reflect measured voltage curve $U_m$.

A quick temporal change of time-discrete output-voltage measured values $V_i$ can thus be taken into consideration via a smaller number M of filtered voltage measured values $Y_j$ considered for the corresponding (block) averaging than would be required for a slower temporal change of time-discrete output-voltage measured values $V_i$. Instead of the calculation of few averages across large block lengths having many filtered voltage measured values $Y_j$ (at a slow temporal change), (block) averages are executed across small block lengths having few filtered voltage measured values $Y_j$ (at a quicker temporal change) in order to depict measured voltage $U_m$ as precisely and efficiently as possible regarding the calculation effort and storage capacity 47 using time-discrete output-voltage measured values $V_i$.

Figure 11:
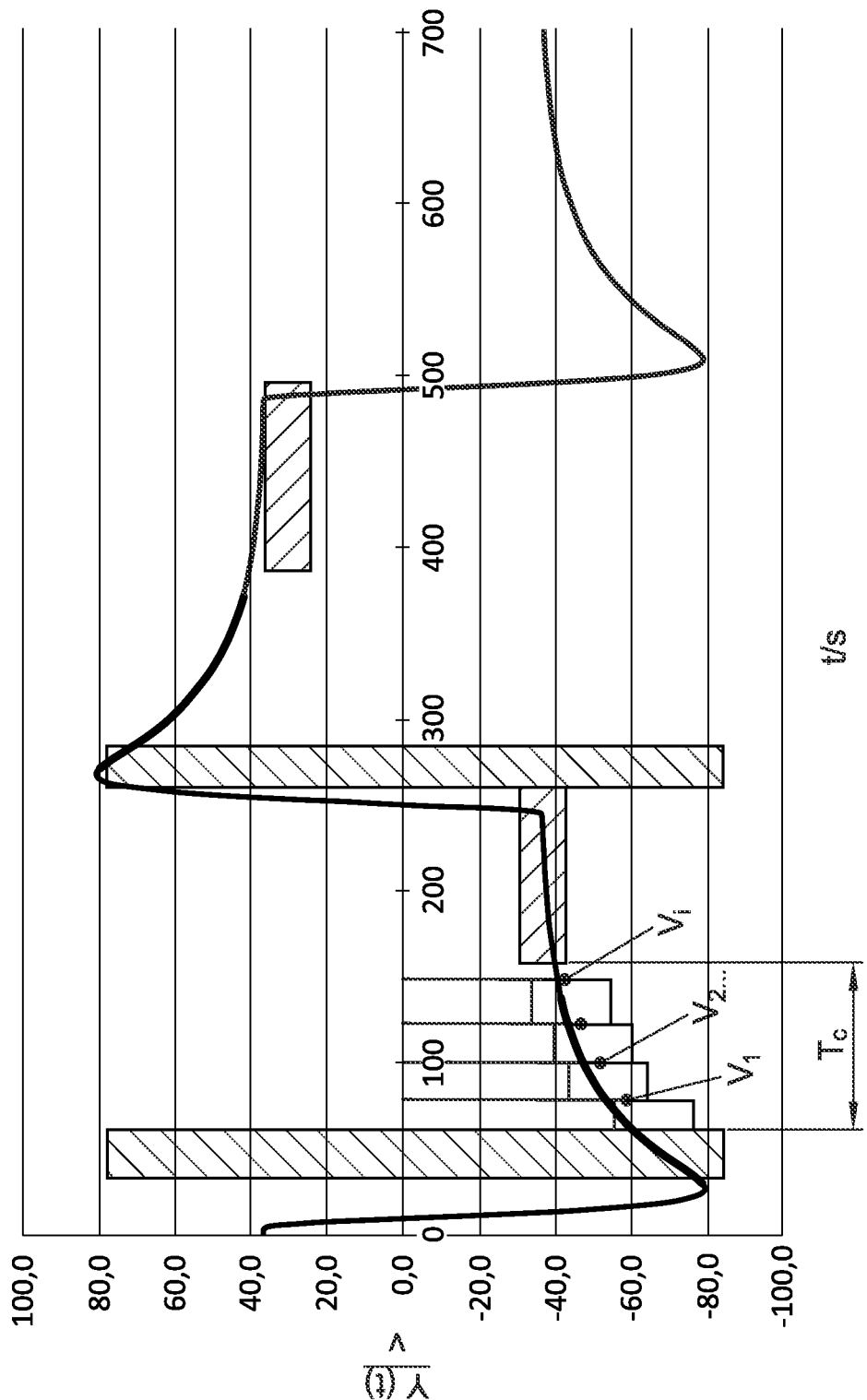
FIG. 11: schematically shows a second averaging with adaption.

In detail, FIG. 11 schematically illustrates an adaption of the number M of filtered voltage measured values $Y_j$ to be considered in (block) averaging in second averaging 48. In this view, filtered (time-discrete) voltage measured values $Y_j$ are interpolated simplistically by an underlying (virtual) continuous-time filtered measuring signal Y(t). As a starting variable of second averaging 48 using first control 49, the sequence of time-discrete output-voltage measured values $V_i$ is yielded.

It can be seen that a smaller number M of filtered voltage measured values $Y_j$ (corresponds to a short block length for calculating $V_1$) goes into the block-by-block calculation of the corresponding (block) average value at a quick signal change (steep incline of the curve) within calculation period $T_c$ than at a slow signal change (flat curve and longer block lengths for $V_2$ and $V_1$).

Figure 12:
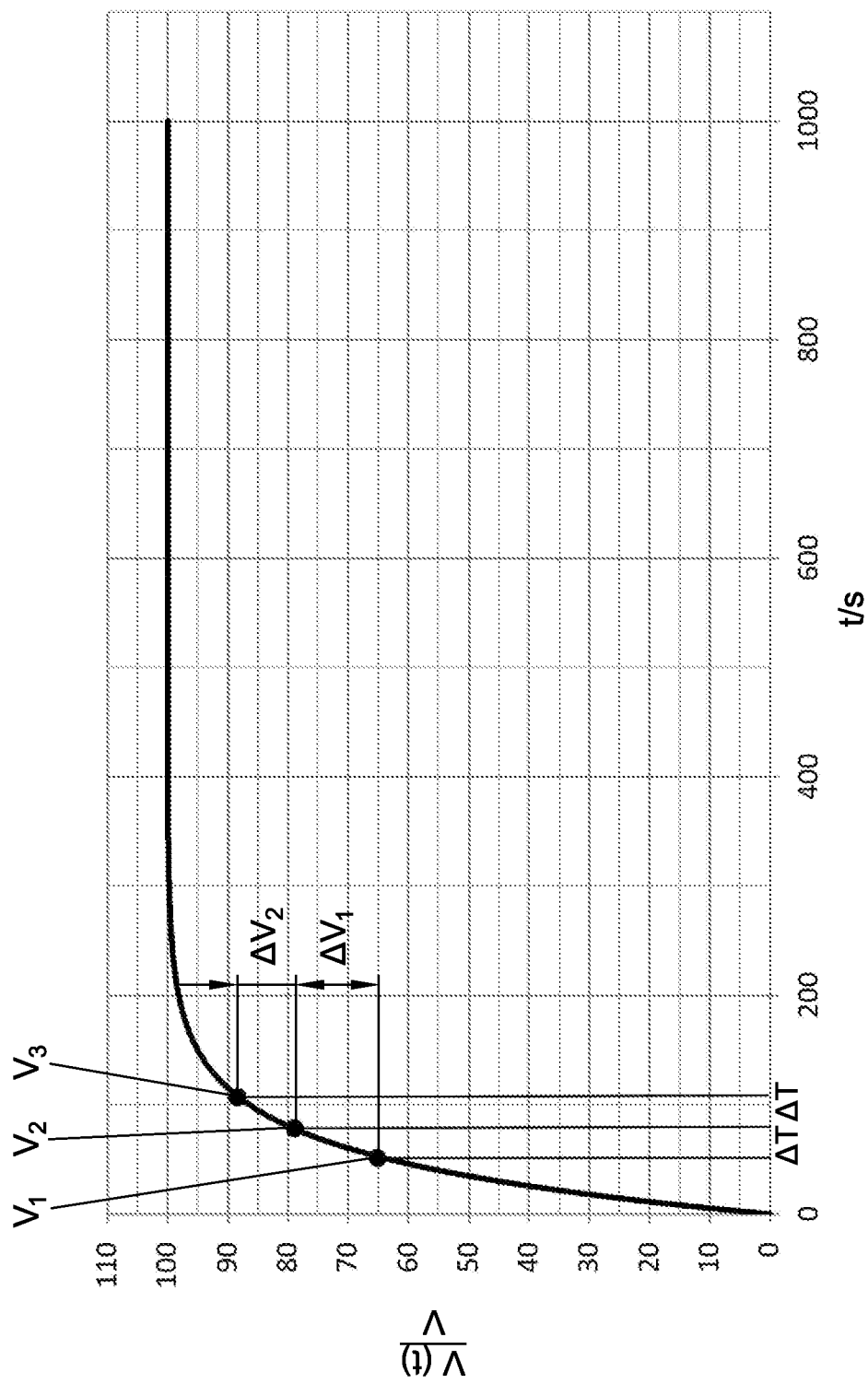
FIG. 12: shows a calculating of derivatives of the first and second order.

FIG. 12 shows the calculation of derivative of the first order $V'_i$ and second order $V''_i$. For time-discrete signals, the following is yielded in an exemplary manner for the three shown temporally consecutive time-discrete output-voltage measured values $V_i=\{V1, V2, V3\}$ with $$\Delta V1 = V2 - V1, \Delta V2 = V3 - V2 \text{ and}$$

$$V'_1 = \Delta V1/\Delta T, V'_2 = \Delta V2/\Delta T \text{ as well as}$$

$$V''_1 = \frac{V'_2 - V'_1}{\Delta T} \text{ time constant } tau_1 \text{ to } tau_1 = -\frac{V'_1}{V''_1}$$

$$tau_1 = -\frac{\Delta V1}{\Delta V2 - \Delta V1} * \Delta T = -\frac{V2 - V1}{(V3 - V2) - (V2 - V1)} * \Delta T$$

Deviating therefrom, instead of the derivative of the first order for value pair {V1, V2} in the numerator of the negative quotient, the derivative of the first order for value pair {V2, V3} or the average value of both value pairs can also be used according to $$tau_1 = -\frac{\frac{\Delta V2 + \Delta V1}{2}}{\Delta V2 - \Delta V1} * \Delta T = -\frac{(V3 - V1)/2}{(V3 - V2) - (V2 - V1)} * \Delta T$$

Revisiting FIG. 6, time constants $tau_i$ are calculated in blocks 50, 52, from which an effective tau value tau_eff is calculated in block 54, based on prepared time-discrete output-voltage measured values $V_i$.

Figure 9:
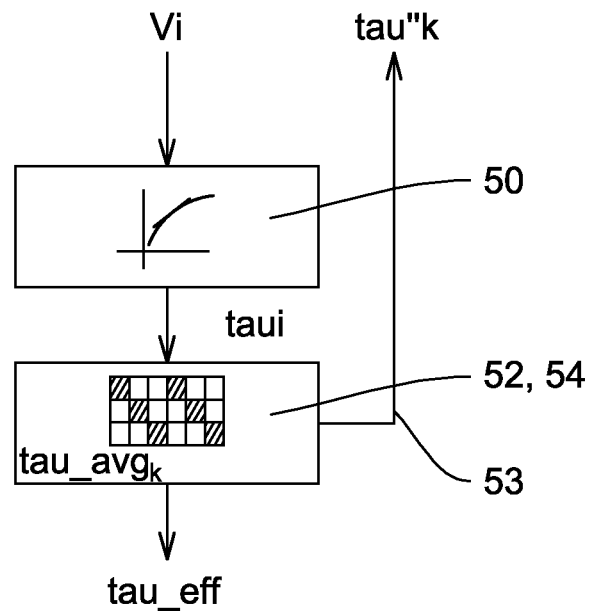
FIG. 9: shows a sequence diagram for calculating the effective tau value with time-constant averaging.

FIG. 9 describes the method steps using time-constant averaging which are required for this purpose in blocks 50, 52, 54.

First, time constants $tau_i$ are calculated 50 as negative quotient from derivative of the first order $V'_i$ and derivative of the second order $V''_i$ of temporally consecutive time-discrete output-voltage measured values $V_i$, as described above.

This continuous calculation of derivatives of the first order $V'_i$ and second order $V''_i$ and quotient formation $V'_i/V''_i$ extends across a calculation period $T_c$ (FIG. 5) within a settling phase of square measuring pulses. Preferably, in this context, calculation period $T_c$ extends from the termination of the settling phase of digital low-pass filter 46 to the beginning of the saturation phase of the capacity charge.

After calculating 50 the sequence of time constants $tau_i$, effective tau value tau_eff is calculated 54 by means of continuous calculation 52 of an interleaved tau average tau_avg$_k$ and a tau derivative of the second degree tau"$_k$ from three time constants $tau_i$ each, time constants $tau_i$ being summarized in an interleaved manner.

Moreover, a second control 53 is introduced, which adapts the number M of filtered voltage measured values $Y_j$ to be considered in second averaging 48 to the temporal curve of interleaved tau averages tau_avg$_k$. In principle, second control 53 is based on the same mechanism as first control 49, though it uses the temporal change of tau average tau_avg$_k$ as a comparative variable instead of time-discrete output-voltage measured values $V_i$. By feeding back tau derivative of the second order tau"$_k$ and comparing it to an admissible second value range, the number M is set in such a manner that tau derivative of the second order tau"$_k$ is within the admissible second value range.

Figure 10:
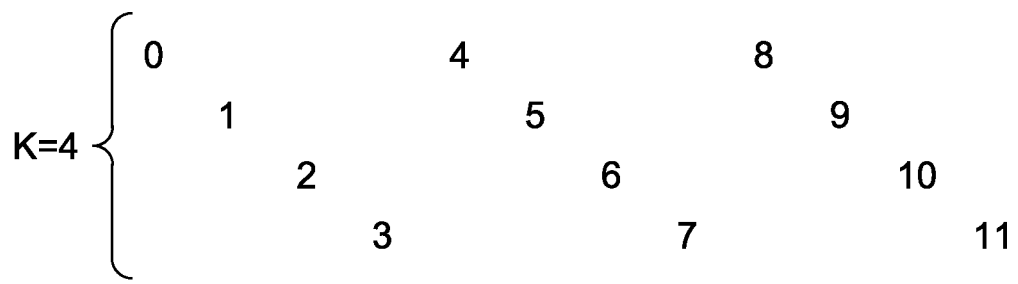
FIG. 10: shows a view of interleaved tau averages.

FIG. 10 shows a view of interleaved tau averages tau_avg$_k$. From preceding calculation 50, a field having, for instance, 12 time constants $tau_i$ having indices 0 to 11 is available. From this field of 12 time constants $tau_i$, K=4 interleaved tau averages tau_avg$_k$ are formed, which each comprise three time constants $tau_i$. Hence, in this example, a first interleaved tau average tau_avg$_1$ is formed from time constants $tau_i$ having indices 0, 4, 8, and a second interleaved tau average tau_avg$_2$ is formed from time constants $tau_i$ having the indices 1, 5, 9, and so forth.

Aside from tau average tau_avg$_k$, a tau derivative of the second order tau"$_k$ is calculated in each instance from these groups of three of time constants $tau_i$, tau derivative of the second order tau"$_k$ serving as an adaption criterion for adapting the number M in second averaging 48 in second control 53.

The calculation of tau derivative of the second degree tau"$_k$ is based on a calculation specification analogous to a calculation of derivative of the second order $V''_i$ of time-discrete output-voltage measured values $V_i$ described above.

Subsequently, a linear averaging takes place across a number K of interleaved tau averages tau_avg$_k$ in order to consider effective tau value tau_eff as a significant time constant for calculating 56 (FIG. 6) of a target point in time Tt.

If thus effective tau value tau_eff is known, target point in time Tt is calculated in block 56 of FIG. 6 after indicating 55 target charging state r.

With charging state r=Vt/V stat as a ratio of a target charging state Vt attained in this target charging state to a stationary end value Vstat (full charging voltage) of capacitor voltage, the following holds true starting from $$Vt = V\text{stat}*(1 - e^{-Tt/tau\_eff})$$

$$r = Vt/V\text{stat} = 1 - e^{-Tt/tau\_eff}$$

$$Tt = tau\_eff * \ln(1 - r)$$

As a difference between target point in time Tt and current point in time T3 (Block 57), first wait time dTr is $$dTr = Tt - T3$$

Finally, it is tested in block 58 whether determined first wait time dTr is less than a pre-specified quick-start time Ts. If first wait time dTr is less than a pre-specified quick-start time Ts, i.e, the quick-start requirements are fulfilled, a safe-to-start signal ss is output, otherwise a not-safe-to-start signal is output as a warning signal.

Figure 7:
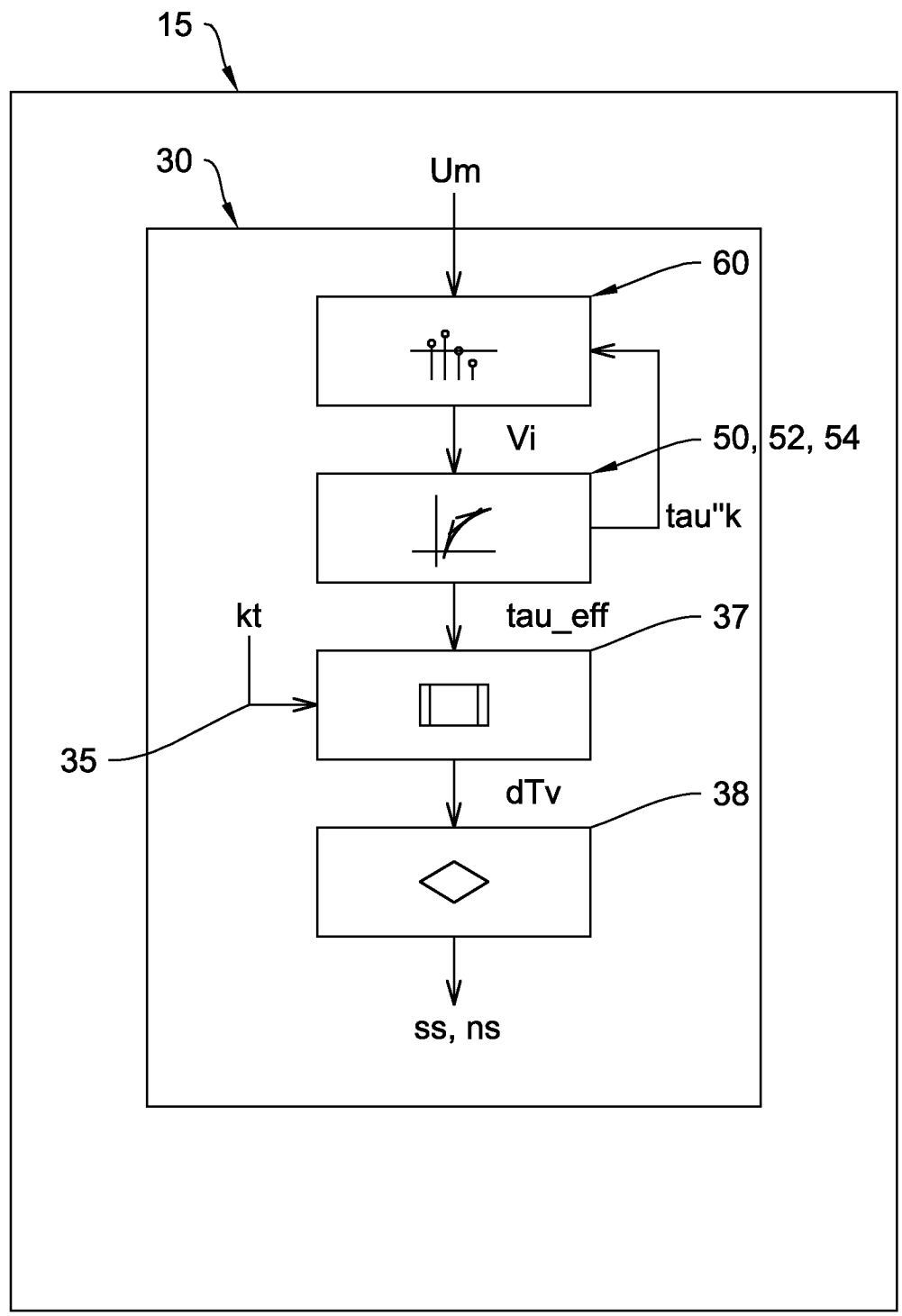
FIG. 7: shows a sequence diagram of the method according to the invention having a parameter of a target charging rate (second variation)

FIG. 7 shows a sequence diagram of the method according to the invention having indication 35 of a target charging rate kt (second variation) within method 15 for determining the insulation resistance.

As in the first variation according to FIG. 6, measured voltage $U_m$ is first processed and stored in block 60 in the form of the sequence of time-discrete output-voltage measured values $V_i$. Calculating 50, 52 of time constants tau, and calculating 54 of effective tau value tau_eff also correspond to the method steps of the first variation.

The difference to the first variation is that instead of target charging state 55, r is assigned a target charging rate 35, kt.

Target charging rate kt corresponds to the temporal change of the capacitor voltage according to $$V't = dVt/dt$$

$$V't = -(V\text{stat}/\text{tau\_eff}) * e^{-Tt/\text{tau\_eff}}$$

Equally, the following applies to previously calculated and stored voltage values V2 and V'2 to T2 point in time t=T2

$$V'2 = -(V\text{stat}/\text{tau\_eff}) * e^{-T2/\text{tau\_eff}}$$

From this, the following holds true $$V't/V'2 = e^{((T2-Tt)/\text{tau\_eff})}$$

and with $$V't = kt$$

$$|T2 - Tt| = |\text{tau\_eff} * \ln(kt/V'2)| = dTr$$

as second wait time dTr.

Here, a test whether second wait time dTr is less than a pre-specified quick-start time (Ts) starting from T2 point in time T2 and thus fulfills the quick-start requirement also takes place in block 38, meaning a safe-to-start signal ss can be output.

The invention claimed is:

1. A method (40) for accelerating an insulation resistance measurement for application in a method (15) for determining the insulation resistance (R_F1, R_F2) according to a pulse measuring method in an ungrounded power supply system (2), a measuring voltage ($U_0$) compiled of temporally consecutive square measuring pulses being applied between an active conductor (HV+, HV−) of the ungrounded power supply system (2) and ground (4) by means of a measuring pulse generator (6) via a coupling branch having a coupling resistance (R_C1, R_C2) and a measuring resistance (R_M1, R_M2) and a continuous-time curve of a voltage ($U_m$) measured via the measuring resistance (R_M1, R_M2) being captured, the method comprising the following steps:

forming and storing a sequence of time-discrete output-voltage measured values ($V_i$) from the continuous-time curve of the measured voltage ($U_m$);

calculating time constants (50, $\text{tau}_i$) as negative quotient from a first order derivative ($V'_i$) and a second order derivative ($V''_i$) of time-discrete output-voltage measured values ($V_i$=V1, V2, V3) stored at temporally directly consecutive points in time (T1, T2, T3) in a calculating period ($T_c$) within a settling phase of a square measuring pulse;

calculating an effective tau value (54, tau_eff) via time constant averaging;

providing (55) a target charging state (r) of network capacities (C_F1, C_F2) available in the ungrounded power supply system;

calculating, based on the target charging state (r) and the effective tau value (54, tau-eff), a target point in time (Tt) at which the network capacities (C_F1, C_F2) will have reached the target charging state (r);

calculating a first wait time (dTr) starting from a current point in time (T3) as a difference between the target point in time (Tt) and the current point in time (T3); and outputting a safe-to-start signal (ss) should the first wait time (dTr) be less than an indicated quick-start time (Ts), otherwise outputting a not-safe-to-start signal (ns).

2. The method according to claim 1, wherein the time-discrete output-voltage measured values ($V_i$) are formed by generating a sequence of time-discrete input-voltage measured values ($U_i$) by sampling (42) the continuous-time curve of the measured voltage ($U_m$) with a pre-specified sampling rate, by calculating the time-discrete output-voltage measured values ($V_i$) from the time-discrete input-voltage measured values ($U_i$) via measured-value averaging (44, 48) via sampling-rate reduction, by calculating filtered voltage measured values ($Y_i$) via digital low-pass filtering (46) of decimated voltage measured values ($X_i$).

3. The method according to claim 2, wherein the measured-value averaging comprises a first averaging (44), the decimated voltage measured values ($X_i$) each being formed consecutively without overlap via a number N of the time-discrete input-voltage measured values ($U_i$).

4. The method according to claim 2, wherein the measured-value averaging comprises a second averaging (48), the time-discrete output-voltage measured values ($V_i$) each being formed consecutively without overlap via a number M of the filtered voltage measured values ($Y_i$) and the number M being adapted to the temporal behavior of the time-discrete output-voltage measured values ($V_i$).

5. The method according to claim 4, wherein an adaption takes place via a first control (49), which sets the number M as a function of the second order derivative ($V''i$) of the time-discrete output-voltage measured values (Vi) in such a manner that the second order derivative ($V''i$) of the time-discrete output-voltage measured values (Vi) is within an admissible first value range.

6. The method according to claim 4, wherein an interleaved tau average ($\text{tau\_avg}_k$) and a tau second order derivative ($\text{tau}''_k$) are each calculated in the time-constant averaging for calculating the effective tau value (54, tau_eff) continuously from three time constants ($\text{tau}_i$), which are summarized in an interleaved manner, a second control (53) taking place which sets the number M as a function of the tau second order derivative ($\text{tau}''_k$) in such a manner that the tau second order derivative ($\text{tau}''_k$) is within an admissible second value range, and subsequently an averaging takes place via a number K of the interleaved tau averages ($\text{tau\_avg}_k$) for calculating the effective tau value (tau_eff).

7. The method according to claim 1, wherein a stationary final value (Vstat) of a capacitor voltage is calculated from one of the stored, time-discrete voltage measured values ($V_i$=V1, V2, V3), from the correspondingly assigned point in time (t1, t2, t3) and from the effective tau value (tau_eff).

* * * * *